(12) United States Patent
Makioka

(10) Patent No.: US 7,227,418 B2
(45) Date of Patent: Jun. 5, 2007

(54) POWER AMPLIFIER

(75) Inventor: Satoshi Makioka, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/038,060

(22) Filed: Jan. 21, 2005

(65) Prior Publication Data

US 2005/0218990 A1    Oct. 6, 2005

(30) Foreign Application Priority Data

Mar. 31, 2004    (JP) ............................. 2004-105051

(51) Int. Cl.
*H03F 3/68*    (2006.01)
(52) U.S. Cl. .................................... 330/295
(58) Field of Classification Search ........ 330/295–296, 330/124 R, 289, 207 P
See application file for complete search history.

(56) References Cited

U.S. PATENT DOCUMENTS

| 5,608,353 | A | 3/1997 | Pratt | |
|---|---|---|---|---|
| 5,629,648 | A | 5/1997 | Pratt | |
| 6,448,859 | B2 * | 9/2002 | Morizuka | 330/295 |
| 6,661,290 | B2 | 12/2003 | Sugiura | |
| 2002/0097097 | A1 | 7/2002 | Sugiura | |

FOREIGN PATENT DOCUMENTS

JP    A 2002-217378    8/2002

OTHER PUBLICATIONS

Foregin Office Action dated Jan. 17, 2007 for Japanese Patent Application No. 2004-105051.

* cited by examiner

*Primary Examiner*—Robert Pascal
*Assistant Examiner*—Hieu Nguyen
(74) *Attorney, Agent, or Firm*—McDermott Will & Emery LLP

(57) ABSTRACT

In order to supply a bias voltage to the base terminals of heterojunction bipolar transistors (HBTs) Q1 to Q3 connected in parallel to one another, resistors RB1 to RB3 and heterojunction bipolar transistors QB1 to QB3 whose base terminals are connected to the collector terminal thereof are provided. The amplifier transistors Q1 to Q3 have the same temperature characteristics as those of the bias-producing transistors QB1 to QB3. With the bias circuit, it is possible to compensate for the temperature characteristics of the amplifier transistors Q1 to Q3. Since the resistance values of the resistors RB1 to RB3 can be decreased, it is possible to suppress the decrease in the output power and to prevent the occurrence of the collapse phenomenon. Thus, it is possible to obtain a power amplifier capable of preventing the thermal runaway and compensating for the temperature characteristics without deteriorating the output characteristics.

8 Claims, 6 Drawing Sheets

POWER AMPLIFIER

BACKGROUND OF THE INVENTION

1. Field of the Invention

The present invention relates to a power amplifier, and more particularly to a power amplifier having an amplifier circuit including a plurality of heterojunction bipolar transistors connected in parallel to one another.

2. Description of the Background Art

Along with the recent advancements in communications devices, there is a significantly growing demand for high-frequency, high-power devices. Particularly, mobile telephones require high-power devices that operate with high efficiencies in order to realize both a high-power operation and a long talk time using a battery. Thus, there is needed a high-power device capable of efficiently converting an input DC power to a high-frequency power while suppressing the internal power loss as much as possible.

Field effect transistors using a GaAs semiconductor are widely employed in high-power devices meeting such demands. An approach that has been attracting public attention in recent years is to use heterojunction bipolar transistors (hereinafter referred to also as "HBTs") in high-power devices. An HBT is a bipolar transistor using a heterojunction of a compound semiconductor, and has desirable high-frequency characteristics and a high current-driving capability.

A high-frequency, high-power device includes a plurality of transistors connected in parallel to one another on a semiconductor substrate in order to output a high-frequency high power. FIG. 7 is a circuit diagram showing a configuration of a power amplifier including a plurality of HBTs as disclosed in U.S. Pat. No. 5,608,353. Referring to FIG. 7, a power amplifier 9 includes three amplifier transistors Q1 to Q3, each being a heterojunction bipolar transistor (HBT). The base terminals of the amplifier transistors Q1 to Q3 are connected to an input terminal PIN via capacitors CB1 to CB3, respectively.

A predetermined bias voltage is supplied to the base terminals of the amplifier transistors Q1 to Q3. The bias voltage is produced by resistively dividing the voltage applied to a bias power supply terminal VB with a resistor RB0 and a bias-producing transistor QB0. The bias-producing transistor QB0 is a heterojunction bipolar transistor (HBT), as are the amplifier transistors Q1 to Q3. The collector terminal and the base terminal of the bias-producing transistor QB0 are connected to each other. Thus, the bias-producing transistor QB0 functions as a diode.

In a power amplifier, a portion of a DC power provided as the power supply or a portion of a high-frequency power outputted as a signal is converted to heat, thus resulting in a power loss. In a power amplifier including a plurality of HBTs, heat from each HBT interferes with heat from other HBTs, and heat is localized at a particular HBT, thereby causing a phenomenon in which the collector current increases in the HBT at which heat is localized (hereinafter referred to as the "collapse phenomenon"). With such a collapse phenomenon, the HBTs no longer operate uniformly, thus reducing the gain and the power efficiency thereof, and possibly deteriorating or breaking the device.

In the power amplifier 9, resistors RB1 to RB3 are provided, for preventing thermal runaway, between the bias circuit (including the resistor RB0 and the bias-producing transistor QB0) and the base terminals of the amplifier transistors Q1 to Q3, respectively. The bias-producing transistor QB0 is an HBT having the same temperature characteristics as those of the amplifier transistors Q1 to Q3. Therefore, even if the characteristics of the amplifier transistors Q1 to Q3 change, the change can be canceled out by the change in the characteristics of the bias circuit. Thus, with the power amplifier 9, all HBTs can operate uniformly, thereby preventing the occurrence of the collapse phenomenon.

However, the conventional power amplifier described above includes a resistor provided in series with the base terminal of each HBT. If the base current increases during a high-power operation, the base potential is decreased due to the resistor, thereby decreasing the output power.

SUMMARY OF THE INVENTION

Therefore, an object of the present invention is to provide a power amplifier capable of preventing the thermal runaway and compensating for the temperature characteristics without deteriorating the output characteristics.

The present invention has the following features to attain the object mentioned above.

A power amplifier of the present invention includes: a plurality of amplifier heterojunction bipolar transistors connected in parallel to one another, each including an emitter terminal being grounded, a base terminal via which an input signal is received, and a collector terminal via which an amplified signal is outputted; and a bias circuit for supplying a bias voltage to the base terminals of the amplifier heterojunction bipolar transistors. The bias circuit includes: a power-supply-side circuit for connecting the base terminals of the amplifier heterojunction bipolar transistors to a power supply terminal; and a plurality of unidirectional elements provided between a ground and the base terminals of the amplifier heterojunction bipolar transistors for allowing a current to pass in a predetermined direction.

The unidirectional elements may each be a heterojunction bipolar transistor whose base and collector terminals are connected to each other. Preferably, the heterojunction bipolar transistor has the same structure or the same temperature characteristics as those of the amplifier heterojunction bipolar transistor. Alternatively, the unidirectional element may be a diode. Preferably, the diode has the same temperature characteristics as those of the amplifier heterojunction bipolar transistor.

The power-supply-side circuit may be a circuit including a plurality of resistive elements one ends of which are commonly connected to the power supply terminal and the other ends of which are connected to the base terminals of the amplifier heterojunction bipolar transistors. Alternatively, the power-supply-side circuit may be a circuit including a resistive element one end of which is connected to the power supply terminal and the other end of which is connected to the base terminals of the amplifier heterojunction bipolar transistors, or a circuit that connects the base terminals of the amplifier heterojunction bipolar transistors to the power supply terminal with no resistive element therebetween.

The power amplifier may further include, at the base terminals of the amplifier heterojunction bipolar transistors, a plurality of capacitors for removing a DC component of the input signal.

With the power amplifier of the present invention, it is possible to separately produce a bias voltage to be supplied to the base terminal of each amplifier heterojunction bipolar transistor through resistive division with the power-supply-side circuit and the unidirectional element. Moreover, with the bias circuit, it is possible to compensate for the temperature characteristics of the amplifier heterojunction bipolar transistors.

Moreover, since the unidirectional element with the bias voltage being applied thereto has a small resistance value, it is possible to accordingly decrease the resistance value of the resistors included in the power-supply-side circuit. Thus, it is possible to suppress the decrease in the base potential due to the resistors included in the bias circuit and to suppress the decrease in the output power. Moreover, it is possible to suppress the heat generation in the bias circuit and to prevent the occurrence of the collapse phenomenon.

Thus, the power amplifier of the present invention is capable of preventing the thermal runaway and compensating for the temperature characteristics without deteriorating the output characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
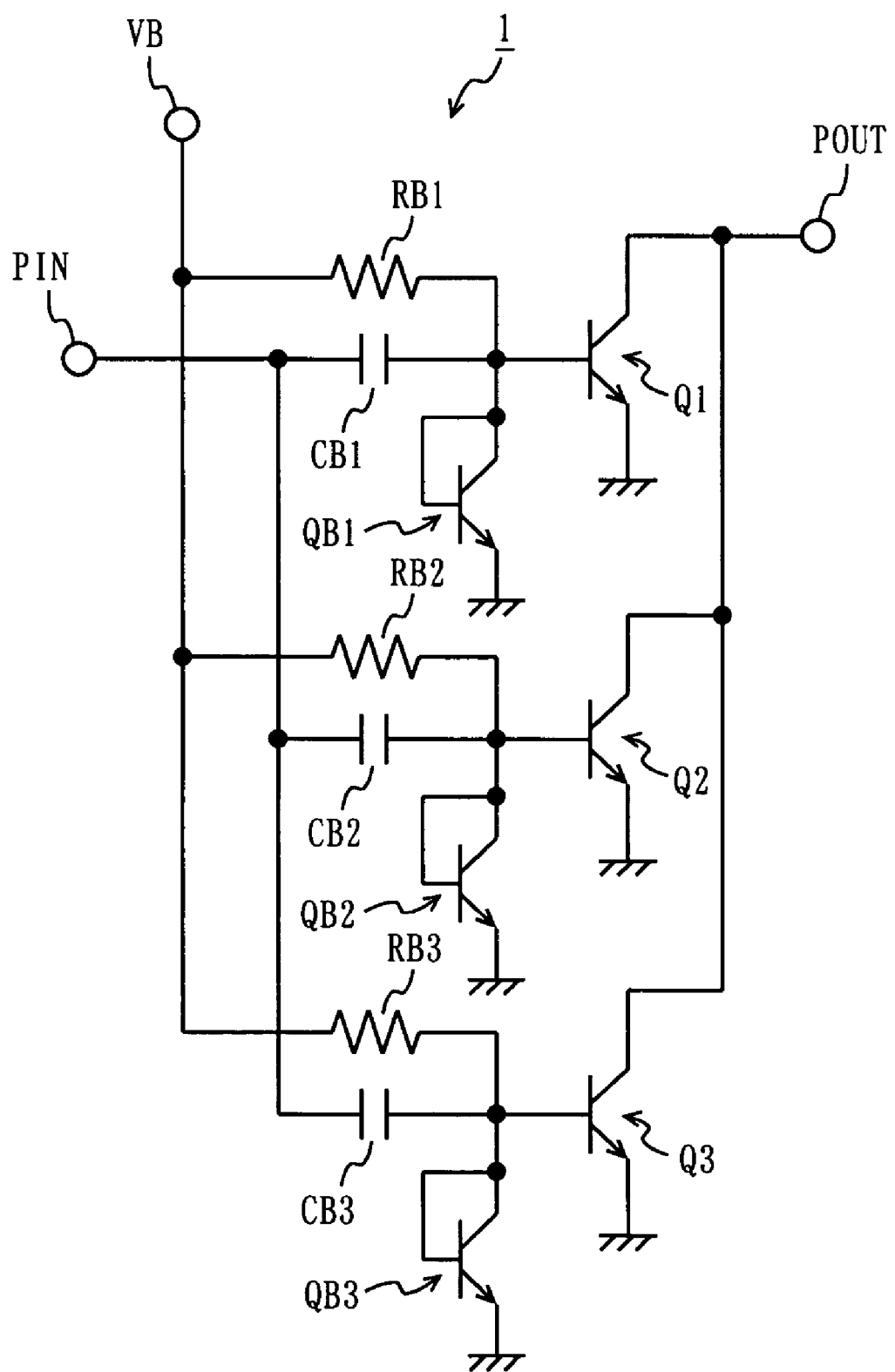
FIG. 1 is a circuit diagram showing a configuration of a power amplifier according to a first embodiment of the present invention.

FIG. 1 is a circuit diagram showing a configuration of a power amplifier 1 according to a first embodiment of the present invention. Referring to FIG. 1, the power amplifier 1 includes the amplifier transistors Q1 to Q3, the capacitors CB1 to CB3, the resistors RB1 to RB3, bias-producing transistors QB1 to QB3, the input terminal PIN, an output terminal POUT and the bias power supply terminal VB. The resistors RB1 to RB3 and the bias-producing transistors QB1 to QB3 together form a bias circuit, and the amplifier transistors Q1 to Q3 together form an amplifier circuit.

A high-frequency signal (RF signal) is inputted via the input terminal PIN. The input RF signal is amplified through the amplifier circuit formed by the amplifier transistors Q1 to Q3, and the amplified signal is outputted via the output terminal POUT. The bias circuit supplies a bias voltage to the base terminals of the amplifier transistors Q1 to Q3 based on the voltage applied to the bias power supply terminal VB.

Each of the amplifier transistors Q1 to Q3 is a heterojunction bipolar transistor (HBT) whose conductivity type is NPN. The amplifier transistors Q1 to Q3 are provided along a path extending from the input terminal PIN to the output terminal POUT while being connected in parallel to one another. More specifically, the emitter terminal of each of the amplifier transistors Q1 to Q3 is grounded. The collector terminal of each of the amplifier transistors Q1 to Q3 is connected to the output terminal POUT. The base terminals of the amplifier transistors Q1 to Q3 are connected to the input terminal PIN via the capacitors CB1 to CB3, respectively. The capacitors CB1 to CB3 remove the DC component of the input RF signal, and each of the amplifier transistors Q1 to Q3 amplifies a signal received via the base terminal thereof (more specifically, a signal received via the base terminal thereof whose DC component has been removed) and outputs the amplified signal via the collector terminal thereof. Since the amplifier transistors Q1 to Q3 are HBTs, the output current of each of the amplifier transistors Q1 to Q3 increases when the temperature increases.

The bias circuit formed by the resistors RB1 to RB3 and the bias-producing transistors QB1 to QB3 produces a bias voltage separately for each of the amplifier transistors Q1 to Q3. Each of the bias-producing transistors QB1 to QB3 is a heterojunction bipolar transistor (HBT) whose conductivity type is NPN, as is each of the amplifier transistors Q1 to Q3. In the present embodiment, the bias-producing transistors QB1 to QB3 are HBTs having the same structure as that of the amplifier transistors Q1 to Q3. Using HBTs of the same structure, the temperature characteristics of the bias-producing transistors QB1 to QB3 coincide with those of the amplifier transistors Q1 to Q3.

The bias voltage supplied to the base terminal of the amplifier transistor Q1 is produced by resistively dividing the voltage applied to the bias power supply terminal VB with the resistor RB1 and the bias-producing transistor QB1. More specifically, the resistor RB1 is provided between the bias power supply terminal VB and the base terminal of the amplifier transistor Q1, and the bias-producing transistor QB1 is provided between the base terminal of the amplifier transistor Q1 and the ground. The emitter terminal of the bias-producing transistor QB1 is grounded, and the base and collector terminals thereof are both connected to the base terminal of the amplifier transistor Q1. The bias-producing transistor QB1 whose base and collector terminals are connected together functions as a diode.

Similarly, the bias voltage supplied to the base terminal of the amplifier transistor Q2 is produced through resistive division with the resistor RB2 and the bias-producing transistor QB2, and the bias voltage supplied to the base terminal of the amplifier transistor Q3 is produced through resistive division with the resistor RB3 and the bias-producing transistor QB3. Thus, the bias voltages supplied to the base terminals of the amplifier transistors Q1 to Q3 are produced by the power-supply-side circuit (including the resistors RB1 to RB3 one ends of which are commonly connected to the bias power supply terminal VB and the other ends of which are connected to the base terminals of the amplifier transistors Q1 to Q3, respectively) and the bias-producing transistors QB1 to QB3 (provided between the ground and the base terminals of the amplifier transistors Q1 to Q3, respectively, and functioning as diodes).

Figure 2:
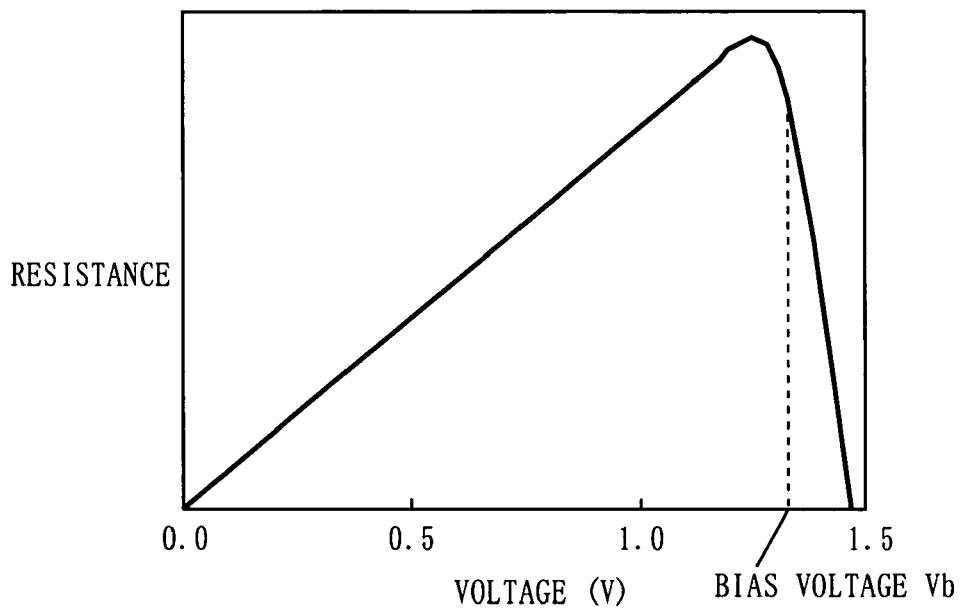
FIG. 2 shows voltage-resistance characteristics of a bias-producing transistor included in power amplifiers according to the first to third embodiments of the present invention.

FIG. 2 shows voltage-resistance characteristics of the bias-producing transistors QB1 to QB3 functioning as diodes. In FIG. 2, the horizontal axis represents the voltage and the vertical axis represents the resistance. Referring to FIG. 2, the resistance of the bias-producing transistors QB1 to QB3 increases in proportion to the voltage while the voltage value is less than a certain value (about 1.25 V in the example of FIG. 2; hereinafter referred to as the "boundary value"), and sharply drops as the voltage exceeds the boundary value. With ordinary class A or class AB power amplifiers, a bias voltage higher than the boundary value (a bias voltage Vb shown in FIG. 2) is supplied to the base terminals of the amplifier transistors Q1 to Q3.

Figure 3:
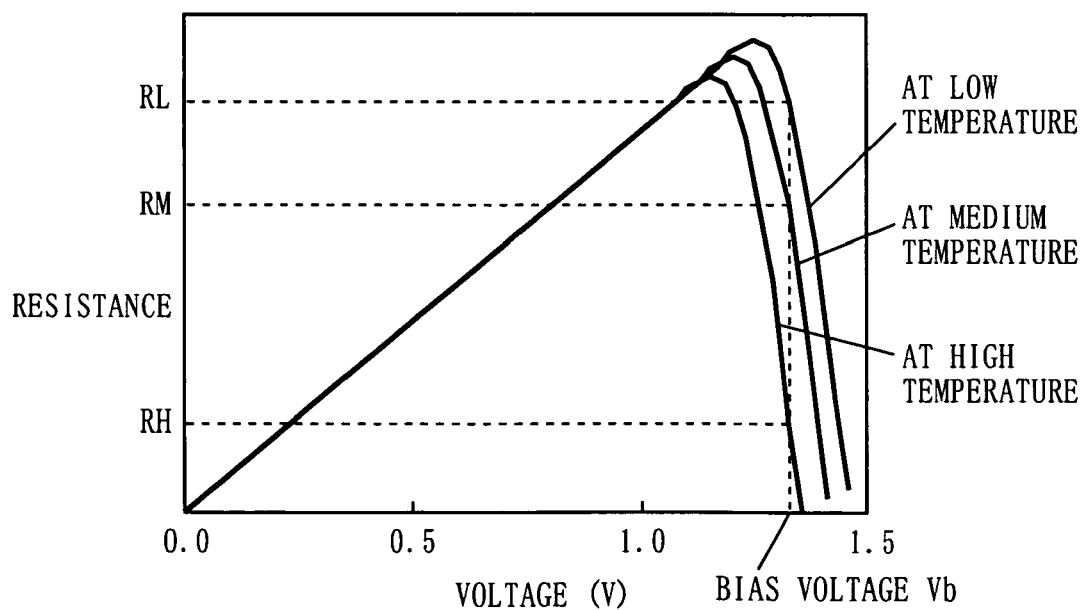
FIG. 3 shows the voltage-resistance characteristics of FIG. 2 varying depending on the temperature.

FIG. 3 shows the voltage-resistance characteristics of FIG. 2 varying depending on the temperature. Referring to FIG. 3, as the temperature increases, the voltage-resistance characteristics curve shifts to the left, whereby the resistance value for the bias voltage Vb decreases. Where the resistance values for low, medium and high temperatures are denoted by RL, RM and RH, respectively, RL>RM>RH holds true.

As described above, with the power amplifier 1, the resistance of the bias-producing transistors QB1 to QB3 decreases as the temperature increases. The bias voltages supplied to the base terminals of the amplifier transistors Q1 to Q3 are produced through resistive division with the resistors RB1 to RB3 and the bias-producing transistors QB1 to QB3, respectively, and the bias-producing transistors QB1 to QB3 are each provided on the ground side of the resistive divider circuit. Therefore, as the temperature increases, the bias voltages supplied to the base terminals of the amplifier transistors Q1 to Q3 decrease. Thus, the bias circuit has a function of decreasing the output current when the temperature increases. Therefore, with the bias circuit, it is possible to compensate for the temperature characteristics of the amplifier transistors Q1 to Q3.

Figure 7:
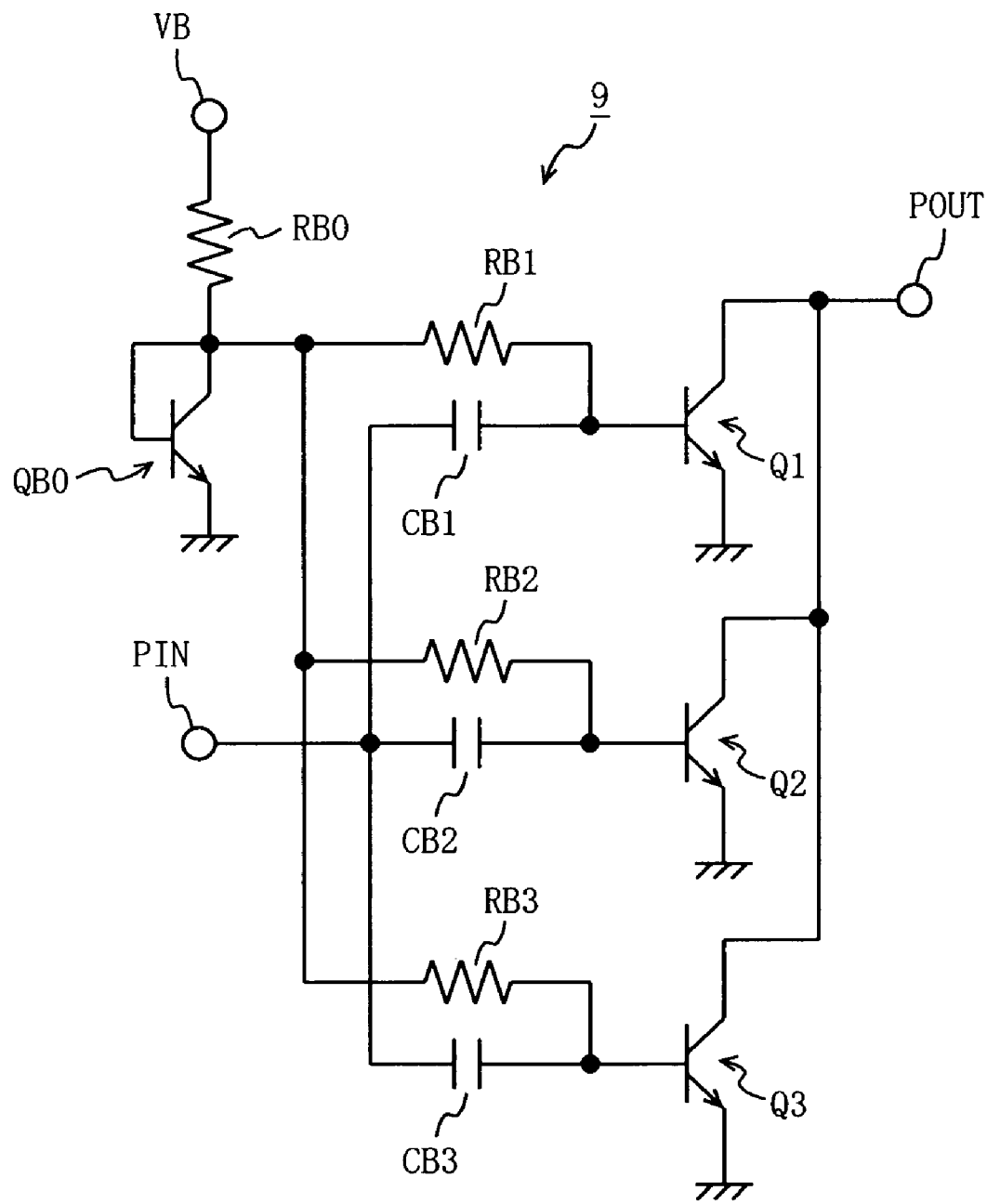
FIG. 7 is a circuit diagram showing a configuration of a conventional power amplifier.

Moreover, the bias-producing transistors QB1 to QB3 with the bias voltage Vb being applied thereto have a relatively small resistance value. Therefore, the resistance value of the resistors RB1 to RB3 forming the resistive divider circuit together with the bias-producing transistors QB1 to QB3 can be smaller than that for the conventional power amplifier (FIG. 7). Thus, it is possible to suppress the decrease in the base potential due to the resistors RB1 to RB3 and to suppress the decrease in the output power. Moreover, it is possible to suppress the heat generation by the resistors RB1 to RB3 and to prevent the occurrence of the collapse phenomenon.

Second Embodiment

Figure 4:
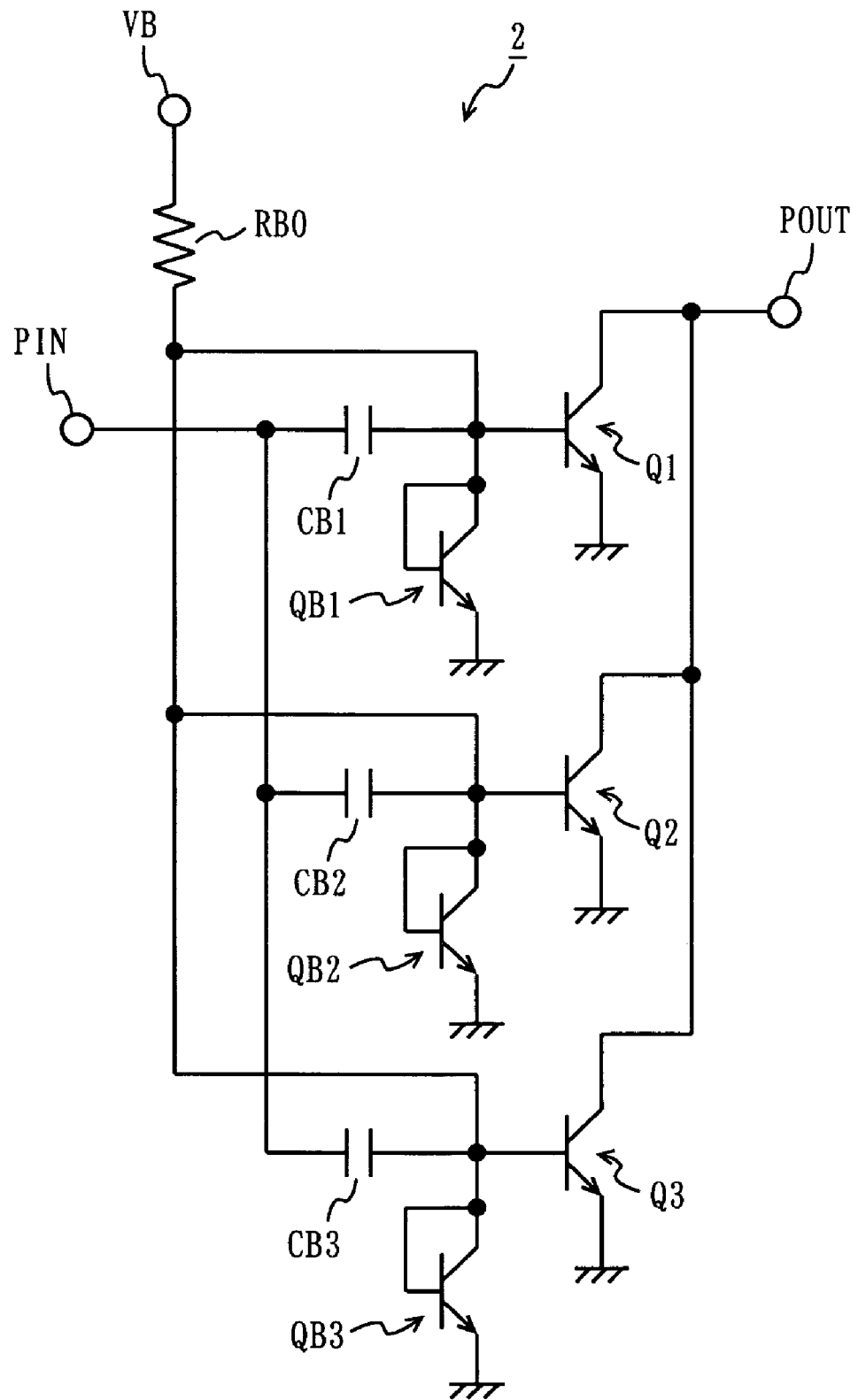
FIG. 4 is a circuit diagram showing a configuration of a power amplifier according to the second embodiment of the present invention.

FIG. 4 is a circuit diagram showing a configuration of a power amplifier 2 according to a second embodiment of the present invention. Referring to FIG. 4, the power amplifier 2 includes the amplifier transistors Q1 to Q3, the capacitors CB1 to CB3, the resistor RB0, the bias-producing transistors QB1 to QB3, the input terminal PIN, the output terminal POUT and the bias power supply terminal VB. In the present embodiment, like elements to those of the first embodiment will be denoted by like reference numerals and will not be further described below.

In the power amplifier 2, the resistor RB0 and the bias-producing transistors QB1 to QB3 together form a bias circuit. One end of the resistor RB0 is connected to the bias power supply terminal VB, and the other end of the resistor RB0 is connected to the base terminals of the amplifier transistors Q1 to Q3 with no other resistor therebetween.

In the power amplifier 2, the bias voltage supplied to the base terminal of the amplifier transistor Q1 is produced by resistively dividing the voltage applied to the bias power supply terminal VB with the resistor RB0 and the bias-producing transistor QB1. Similarly, the bias voltage supplied to the base terminal of the amplifier transistor Q2 is produced through resistive division with the resistor RB0 and the bias-producing transistor QB2, and the bias voltage supplied to the base terminal of the amplifier transistor Q3 is produced through resistive division with the resistor RB0 and the bias-producing transistor QB3. Thus, the bias voltages supplied to the base terminals of the amplifier transistors Q1 to Q3 are produced by the power-supply-side circuit (including the resistor RB0 one end of which is connected to the bias power supply terminal VB and the other end of which is connected to the base terminals of the amplifier transistors Q1 to Q3) and the bias-producing transistors QB1 to QB3 (provided between the ground and the base terminals of the amplifier transistors Q1 to Q3, respectively, and functioning as diodes).

The power amplifier 2 is similar to the power amplifier 1 of the first embodiment except that the resistors RB1 to RB3 are replaced by the resistor RB0, and operates in a similar manner to the power amplifier 1 of the first embodiment. Therefore, with the bias circuit included in the power amplifier 2, it is possible to compensate for the temperature characteristics of the amplifier transistors Q1 to Q3. Moreover, by decreasing the resistance value of the resistor RB0, it is possible to suppress the decrease in the output power and to prevent the occurrence of the collapse phenomenon.

Third Embodiment

Figure 5:
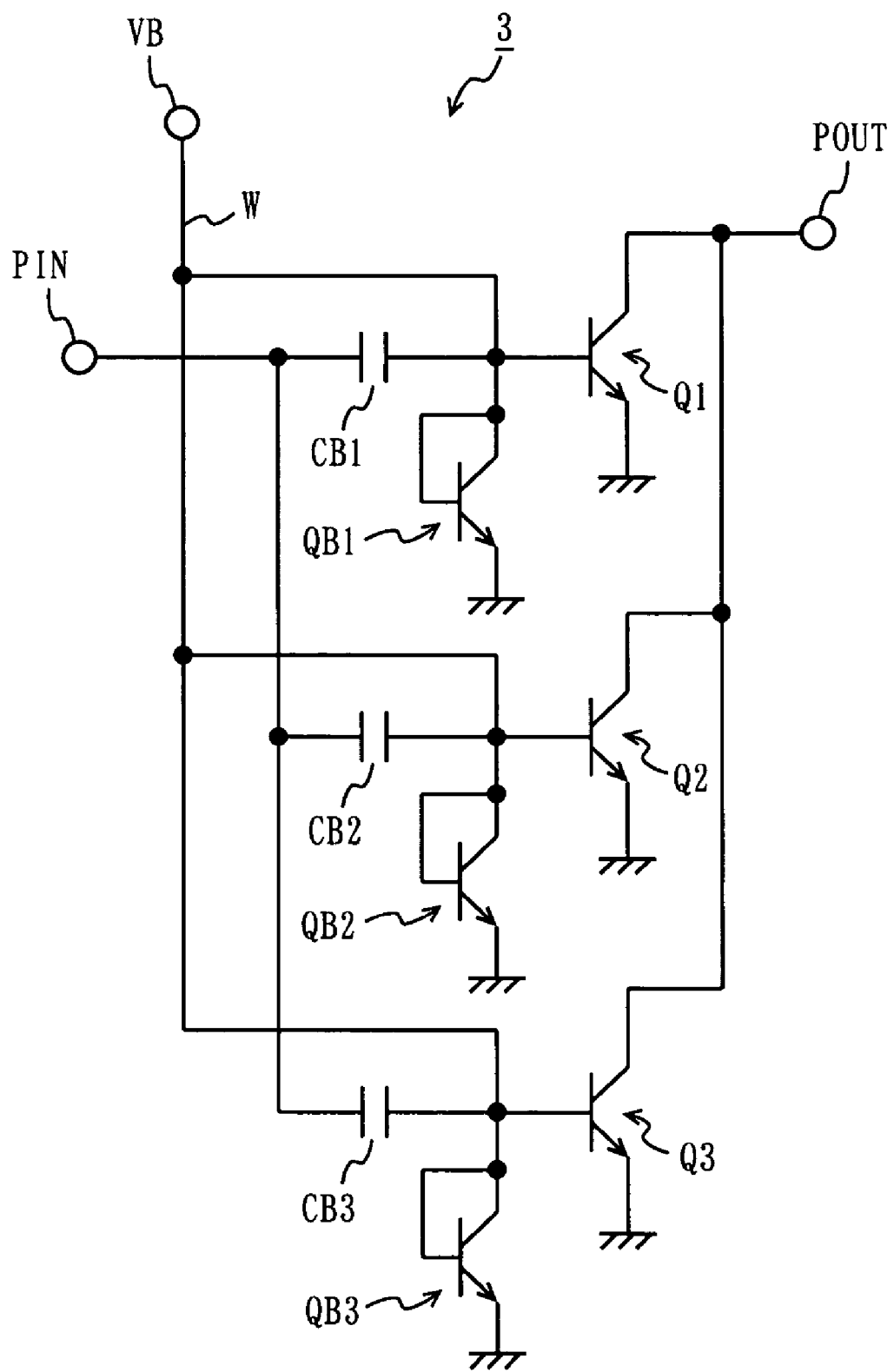
FIG. 5 is a circuit diagram showing a configuration of a power amplifier according to the third embodiment of the present invention.

FIG. 5 is a circuit diagram showing a configuration of a power amplifier 3 according to a third embodiment of the present invention. Referring to FIG. 5, the power amplifier 3 includes the amplifier transistors Q1 to Q3, the capacitors CB1 to CB3, the bias-producing transistors QB1 to QB3, the input terminal PIN, the output terminal POUT and the bias power supply terminal VB. In the present embodiment, like elements to those of the second embodiment will be denoted by like reference numerals and will not be further described below.

In the power amplifier 3, a wire W and the bias-producing transistors QB1 to QB3 together function as a bias circuit. The gate terminals of the amplifier transistors Q1 to Q3 are connected to the bias power supply terminal VB via the wire to the bias power supply terminal VB is supplied as it is to the base terminals of the amplifier transistors Q1 to Q3 as the bias voltage.

The power amplifier 3 is similar to the power amplifier 2 of the second embodiment except that the resistor RB0 is removed, and operates in a similar manner to the power amplifier 2 of the second embodiment except that the voltage applied to the bias power supply terminal VB is used as it is as the bias voltage. Therefore, with the bias circuit included in the power amplifier 3, it is possible to compensate for the temperature characteristics of the amplifier transistors Q1 to Q3. Moreover, by removing the resistor from the bias circuit, it is possible to suppress the decrease in the output power and to prevent the occurrence of the collapse phenomenon.

As described above, with the power amplifiers of the first to third embodiments, it is possible to prevent the thermal runaway and to compensate for the temperature characteristics without deteriorating the output characteristics.

Figure 6:
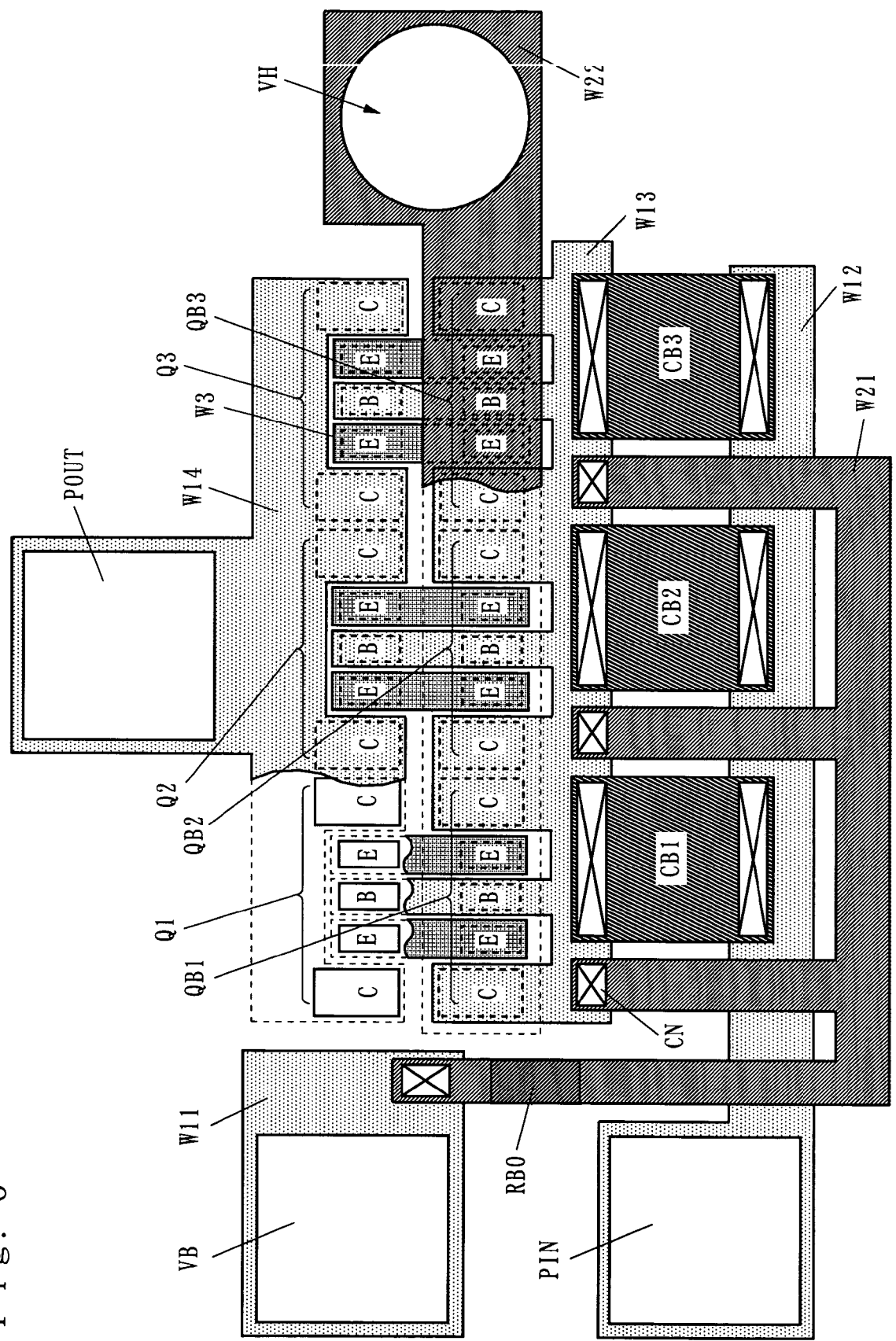
FIG. 6 shows a layout of the components of the power amplifier according to the second embodiment of the present invention.

Each of the power amplifiers of the embodiments above is formed on a semiconductor substrate. FIG. 6 shows the components of the power amplifier 2 according to the second embodiment of the present invention laid out on a semiconductor substrate. In addition to the components of the power amplifier 2 (the amplifier transistors Q1 to Q3, the capacitors CB1 to CB3, input terminal PIN, the output terminal POUT and the bias power supply terminal VB), FIG. 6 shows a via hole VH, wires W11 to W14, W21, W22 and W3, and contacts CN. For the sake of simplicity, FIG. 6 does not show a portion of the wire W13 (a portion covering the base electrode of the amplifier transistor Q1), a portion of the wire W14 (a portion covering the collector electrodes of the amplifier transistor Q1), a portion of the wire W22 (a portion covering the bias-producing transistors QB1 and QB2), and a portion of the wire W3 (a portion covering the emitter electrodes of the amplifier transistor Q1).

Referring to FIG. 6, the wires W11 to W14 are formed in the first wiring layer, and the wires W21 and W22 are formed in the second wiring layer. The contacts CN are provided at positions where wires of different wiring layers are connected to each other. Each of the amplifier transistors Q1 to Q3 and the bias-producing transistors QB1 to QB3 includes one base electrode, two emitter electrodes and two collector electrodes. The amplifier transistor Q1 and the bias-producing transistor QB1 are located near each other. Similarly, the amplifier transistors Q2 and Q3 are located near the bias-producing transistors QB2 and QB3, respectively.

The collector and base terminals of the bias-producing transistors QB1 to QB3 and the base terminals of the amplifier transistors Q1 to Q3 are connected to the wire W13. The wire W13 is connected to the input terminal PIN via the capacitors CB1 to CB3 and also to the bias power supply terminal VB via the resistor RB0. The collector terminals of the amplifier transistors Q1 to Q3 are connected to the wire W14, and the wire W14 is connected to the output terminal POUT. The emitter terminals of the bias-producing transistors QB1 to QB3 and the emitter terminals of the amplifier transistors Q1 to Q3 are connected to the wire W3, and the emitter terminals of the bias-producing transistors QB1 to QB3 are also connected to the wire W22. The wire W22 is connected to the via hole VH, and is connected to the ground provided on the reverse surface of the semiconductor substrate via the via hole VH.

Thus, the RF signal received via the input terminal PIN is inputted to the base terminals of the amplifier transistors Q1 to Q3 via the capacitors CB1 to CB3, and the signal amplified through the amplifier transistors Q1 to Q3 is outputted via the output terminal POUT. Moreover, the bias circuit formed by the resistor RB0 and the bias-producing transistors QB1 to QB3 supplies a predetermined bias voltage to the base terminals of the amplifier transistors Q1 to Q3. Thus, the power amplifier 2 of the second embodiment can be realized. The power amplifier 3 of the third embodiment can be realized by removing the resistor RB0 from the layout shown in FIG. 6, and the power amplifier 1 of the first embodiment can be realized by removing the resistor RB0 and providing the resistors RB1 to RB3 on the wire W21.

In the embodiments described above, the amplifier transistors Q1 to Q3 and the bias-producing transistors QB1 to QB3 are heterojunction bipolar transistors (HBTs). In other embodiments, any other suitable bipolar transistors may be used instead of HBTs. In the embodiments described above, the bias-producing transistors QB1 to QB3 whose base terminals are connected to the emitter terminals thereof are provided on the ground side of the bias circuit. In other embodiments, diodes having the same temperature characteristics as those of the amplifier transistors Q1 to Q3 may be used instead of the bias-producing transistors QB1 to QB3. In the embodiments described above, the power amplifier includes three HBTs. In other embodiments, the power amplifier may include two HBTs or four or more HBTs. It is understood that the power amplifiers of these variations will provide the same effects as those of the embodiments described above.

The power amplifier of the present invention, capable of preventing the thermal runaway and compensating for the temperature characteristics without deteriorating the output characteristics, can suitably be used for high-frequency, high-power devices in wireless communications devices, for example.

While the invention has been described in detail, the foregoing description is in all aspects illustrative and not restrictive. It is understood that numerous other modifications of the invention.

What is claimed is:

1. A power amplifier with a plurality of heterojunction bipolar transistors, the power amplifier comprising:
   a plurality of amplifier heterojunction bipolar transistors connected in parallel to one another, each including an emitter terminal being grounded, a base terminal via which an input signal is received, and a collector terminal via which an amplified signal is outputted; and
   a plurality of capacitors for removing a DC component of the input signal, which are connected to the base terminals of the amplifier heterojunction bipolar transistors; and
   a power-supply-side circuit for connecting the base terminals of the amplifier heterojunction bipolar transistors to a power supply terminal; and
   a plurality of unidirectional elements one ends of which are connected to the base terminals of the amplifier heterojunction bipolar transistors with no resistive element therebetween and other ends of which are connected to a ground for allowing a current to pass in a predetermined direction.

2. The power amplifier according to claim 1, wherein the unidirectional elements are each a heterojunction bipolar transistor whose base and collector terminals are connected to each other.

3. The power amplifier according to claim 2, wherein the heterojunction bipolar transistor being the unidirectional element has the same structure as that of the amplifier heterojunction bipolar transistor.

4. The power amplifier according to claim 2, wherein the heterojunction bipolar transistor being the unidirectional element has the same temperature characteristics as those of the amplifier heterojunction bipolar transistor.

5. The power amplifier according to claim 1, wherein the unidirectional element is a diode.

6. The power amplifier according to claim 5, wherein the diode being the unidirectional element has the same temperature characteristics as those of the amplifier heterojunction bipolar transistor.

7. The power amplifier according to claim 1, wherein the power-supply-side circuit includes a plurality of resistive elements one ends of which are commonly connected to the power supply terminal and the other ends of which are connected to the base terminals of the amplifier heterojunction bipolar transistors.

8. The power amplifier according to claim 1, wherein the power-supply-side circuit includes a resistive element one end of which is connected to the power supply terminal and the other end of which is connected to the base terminals of the amplifier heterojunction bipolar transistors.

* * * * *